(12) United States Patent
Stecher et al.

(10) Patent No.: US 7,737,560 B2
(45) Date of Patent: Jun. 15, 2010

(54) METALLIZATION LAYER FOR A POWER SEMICONDUCTOR DEVICE

(75) Inventors: Matthias Stecher, Munich (DE);
Renate Hofmann, Regensburg (DE);
Joerg Busch, Regensburg (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 11/436,402

(22) Filed: May 18, 2006

(65) Prior Publication Data

US 2007/0267749 A1 Nov. 22, 2007

(51) Int. Cl.
*H01L 23/48* (2006.01)
(52) U.S. Cl. .................................. 257/764; 438/674
(58) Field of Classification Search ................ 257/764
See application file for complete search history.

(56) References Cited

U.S. PATENT DOCUMENTS

| | | | | |
|---|---|---|---|---|
| 5,066,550 A | * | 11/1991 | Horibe et al. | 428/670 |
| 6,126,806 A | * | 10/2000 | Uzoh | 205/182 |
| 6,180,505 B1 | * | 1/2001 | Uzoh | 438/614 |
| 7,190,079 B2 | * | 3/2007 | Andricacos et al. | 257/774 |
| 2004/0121577 A1 | * | 6/2004 | Yu et al. | 438/622 |
| 2006/0160349 A1 | * | 7/2006 | Wong et al. | 438/618 |
| 2006/0202346 A1 | * | 9/2006 | Shih et al. | 257/774 |

* cited by examiner

*Primary Examiner*—Thao X Le
*Assistant Examiner*—Kimberly Trice
(74) *Attorney, Agent, or Firm*—Dicke, Billig & Czaja, PLLC

(57) ABSTRACT

A power semiconductor IC device is disclosed. In one embodiment, the device includes a substrate, and a layer structure formed on the substrate. The layer structure includes a metallization layer including copper, wherein the metallization layer is formed as a stack structure including at least two copper layers and a stabilization layer between the two copper layers.

7 Claims, 5 Drawing Sheets

METALLIZATION LAYER FOR A POWER SEMICONDUCTOR DEVICE

BACKGROUND

In the field of power semiconductor devices and power semiconductor IC (Integrated Circuit) devices such as BCD devices (BCD: Bipolar-CMOS-DMOS), IGBTs and the like, one or more metallization layers are used to conduct large currents (high power currents).

The present assignee identifies its power semiconductor technologies as SPT (Smart Power Technology) and identifies the corresponding technological development stages or generations thereof with a number, i.e. SPT5, SPT6, SPT7.

For example, technology stage SPT6 uses power copper metallizations with a thickness of 20 μm as described, e.g., in DE 103 60 513 A1, which also describes an example of a power DMOS.

FIG. 4, which corresponds to FIG. 1 of DE 103 60 513 A1, shows a cross sectional view of a power DMOS comprising a substrate 1 (made e.g. of Si), field oxide layers 2, transistor and wiring/conductor structures 3, 4, 5, partly connected via plugs/vias 6,7, embedded in a plasma oxide layer 8. A power metallization 10' of copper is deposited as the top layer of the multi-layer wiring/metallization structure.

In manufacturing such a power metallization made of copper (Cu), as described e.g. in US 2005/0127534 A1, the contents of which are incorporated herein by reference, a coating may be applied over the copper, for example by electrogalvanic plating or by electrochemical plating. An example of such a coating is a NiP/Pd/Au layer. The hard NiP layer has several functions, namely the prevention of interdiffusion of Pd, Au and Cu and to prevent that the needles of needle cards (probe) used when testing the final products, penetrate into the Cu. Furthermore, it is prevented that structures below the Cu layer, which are usually mechanically fragile, are damaged or destroyed during the testing or during the bonding. Bonding On Active (BOA) means bonding on bonding pads, which are positioned above electrically active structures as viewed in the pressure applying direction during bonding. BOA is possible if such a hard NiP layer has been applied, because the NiP layer prevents the force applied to the bonding pad during bonding from being transferred to the mechanically fragile structures.

BOA is preferable, because the chip area can be reduced by about 10%, if BOA is used.

However, NiP recrystallizes during thermal treatments such as forming gas tempering or soldering processes. Due to the recrystallization, the NiP layer shrinks to such an extent that cracks are generated in the layer. Usually, the cracks are generated in large structures and start in corners of the metallization layer structure.

Such cracks should be avoided in order to prevent moisture from reaching the copper.

A further problem generated by the shrinking NiP is caused by the high elasticity module of NiP, because the shrinking distorts the wafer disks such that they can not be processed anymore.

For these and other reasons, there is a need for the present invention.

SUMMARY

The present invention provides a power semiconductor device. In one embodiment, the device includes a metallization layer adapted for conducting high power currents, a metallization layer for a power semiconductor device, and a method for manufacturing a metallization layer for a power semiconductor device.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention provides a power semiconductor device. In one embodiment, the device includes a metallization layer adapted for conducting high power currents, a metallization layer for a power semiconductor device, and a method for manufacturing a metallization layer for a power semiconductor device.

One embodiment of a metallization layer for a power semiconductor device will be described referring to FIG. 2.

Figure 4:
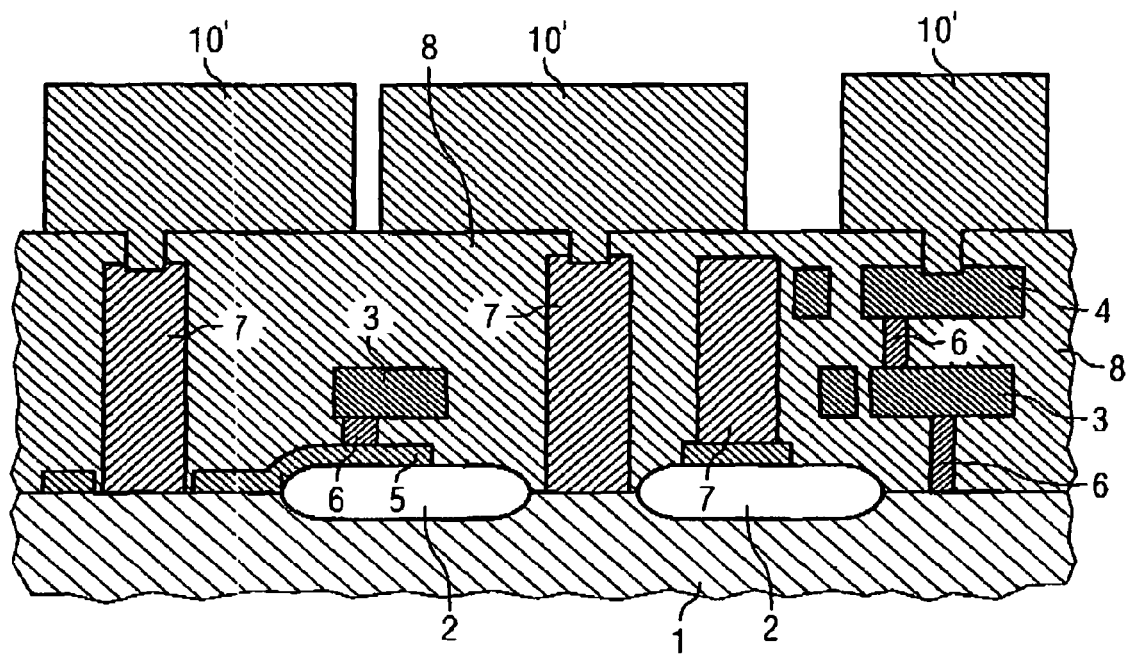
FIG. 4 illustrates a cross-sectional view of a power DMOS disclosed in DE 103 60 513 A1.

FIG. 2 illustrates a metallization layer 10 corresponding to the power metallization 10' in FIG. 4. As illustrated in FIG. 2, the power metallization 10 does not consist of a single layer of copper, but rather the power metallization 10 has a sandwich structure, wherein a first copper layer 10a is deposited on a WTi barrier layer 22. A stabilization layer 11 is deposited on the first copper layer 10a. A second copper layer 10b is deposited on the stabilization layer 11. Accordingly, a sandwich structure, in which the stabilization layer 11 is embedded/sandwiched between the first and second copper layers 10a, 10b is formed.

The metallization layer 10 is arranged on the WTi barrier layer 22, which is provided to prevent Cu diffusion (because of W) and to improve the adhesion to the oxide (because of Ti).

In one embodiment, the stabilization layer 11 is formed of a layer of NiP, and alternatively the stabilization layer 11 may be formed of NiMoP (preferably with a Mo content equal to or less than 5%), NiPd, NiB, or a multi-layer of Ni/NiP/Ni, Ni/NiMoP/Ni (in one embodiment with a Mo content equal to or less than 5%), Ni/NiPd/Ni, Ni/NiB/Ni.

The metallization layer 10 has a thickness selected to be sufficient to conduct the high power currents. In the STP6 technology, the metallization layer 10 has a thickness in the range of 5 to 40 μm, preferably approx. 20 μm. The first and second copper layers 10a, 10b preferably have a thickness in the range of 1 to 10 μm, and the stabilization layer 11 preferably has a thickness in the range of 1 to 5 μm.

In one embodiment shown in FIG. 2, there are first and second copper layers 10a, 10b. However, as an alternative, the layers may also be formed of a material mainly composed of or substantially including copper, which material has current and heat conducting characteristics mainly determined by the copper content such that they are similar to copper.

The sandwich structure illustrated in FIG. 2 is a single stack structure, wherein one stabilization layer 11 is embedded between two power current conducting layers 10a, 10b mainly composed of copper. The sandwich/stack structure may be repeated, thereby resulting in a stack of a power current conducting layer, a stabilization layer, a power current conducting layer, a stabilization layer, a power current conducting layer, a stabilization layer, a power current conducting layer, etc. Such a multi stack structure may include different types of stabilization layers, e.g., one stabilization layer of NiP, one stabilization layer of NiMoP, etc.

The effect of the sandwich/stack structure results in that the stabilization layer has a hardness that is at least twice the hardness of Cu, preferably four times or more the hardness of Cu. The hard layer on top of the lower power current conducting layers mainly composed of copper will prevent the forces exerted during BOA or testing with needle cards from being transferred to the lower structures in limited areas only, as the hard layer will distribute the load to the complete power current conducting layer(s) below.

Figures 2A, 2B:
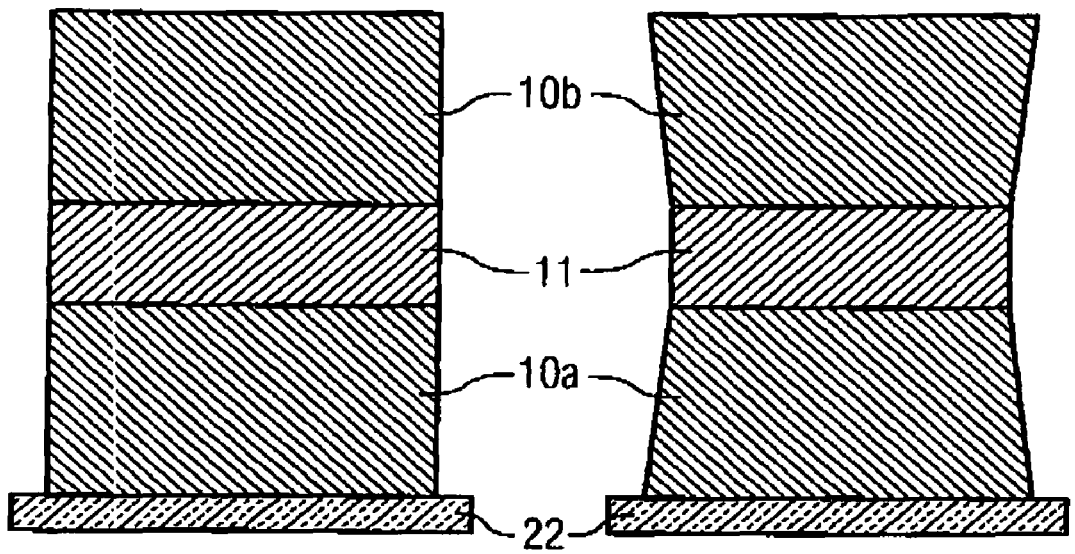
FIG. 2 illustrates a schematic cross-sectional view of a metallization layer for a power semiconductor device according to an embodiment of the present teachings before and after thermal treatment.

As it is apparent from a comparison of FIG. 2a) and b), if the stabilization layer 11 made e.g. of NiP is subjected to a thermal processing such as forming gas tempering that results in a recystallization of the NiP layer, the shrinking of the NiP layer 11 will not cause distortion of the wafer disk, because the stress induced by the shrinking of the NiP layer 11 is introduced essentially uniformly into the copper layer and the lower layer adjacent to the NiP layer in the sandwich structure. Furthermore, the NiP layer is much less liable to cracking due to the equalized stress distribution.

If the metallization layer 10 should be passivated, a passivation layer 24, for example a passivation layer 24 formed as a NiMoP/Pd/Au layer structure, can be formed. This layer structure can be deposited by electrochemical plating. Alternatively, passivation of the Cu is possible by coating the device with an imide. In this case, the imide has to be removed at the positions of the bonding pads in order to allow bonding. Then, the Cu can be passivated in these openings by NiP/Pd/Au or NiMoP/Pd/Au, which is deposited by electrochemical plating. It is also possible to directly bond onto the Cu without an additional passivation in the pad openings.

In the following, a method for manufacturing a metallization layer for a power semiconductor IC device will be described referring to FIG. 1.

Figure 1A:
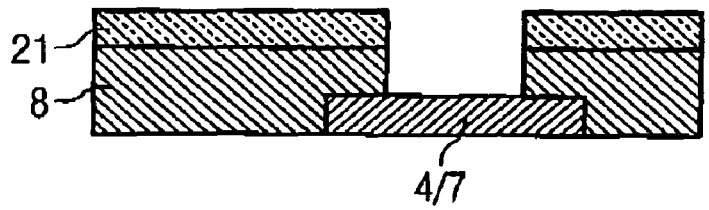
FIG. 1 illustrates cross-sectional views of manufacturing steps of a method for manufacturing a metallization layer for a power semiconductor device according to an embodiment of the present teachings.

As illustrated in FIG. 1a), a bonding pad of a wiring structure 4/7 is located at the base of a through hole, which is formed in a plasma oxide layer 8. Preferably, a passivation layer 21, made e.g. of BPSG, is deposited on this plasma oxide layer 8.

Figure 1B:
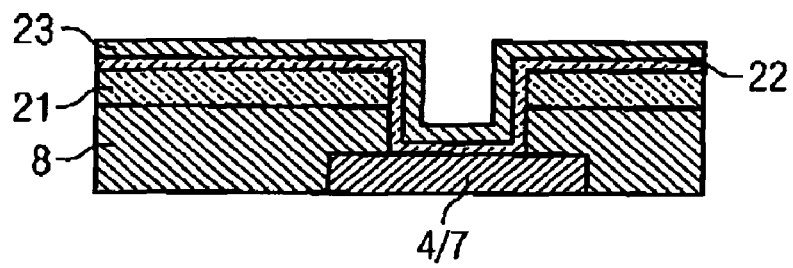

Subsequently, as illustrated in FIG. 1b), a WTi layer 22 and a Cu seed layer 23 are deposited. The Cu seed layer 23 preferably has a thickness of about 300 nm.

Figure 1C:
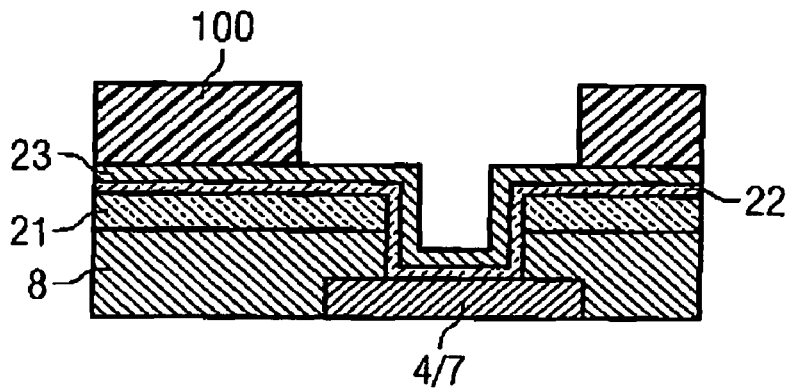
Figure 1D:
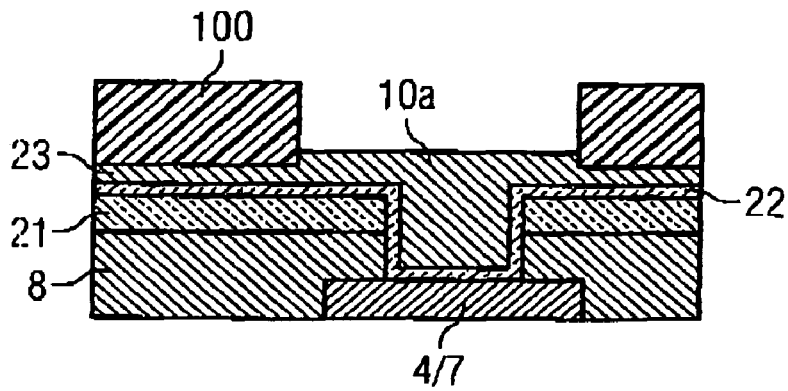

After a photoresist coating and structuring step, a photoresist pattern 100 for the metallization layer is formed as shown in FIG. 1c). As shown in FIG. 1d), a first copper layer 10a is deposited/grown on the Cu seed layer 23 using the photoresist pattern 100, preferably by electrogalvanic plating.

Figure 1E:
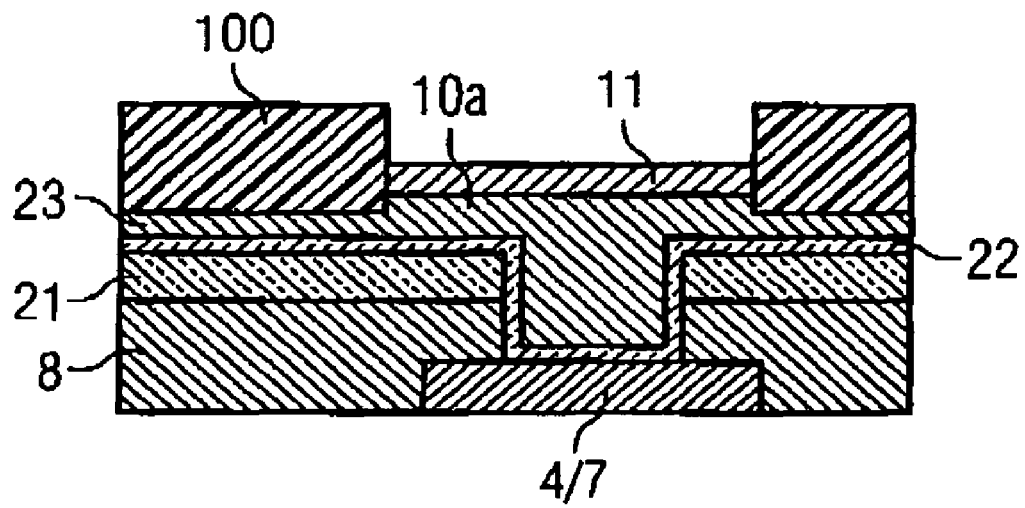
Figure 1F:
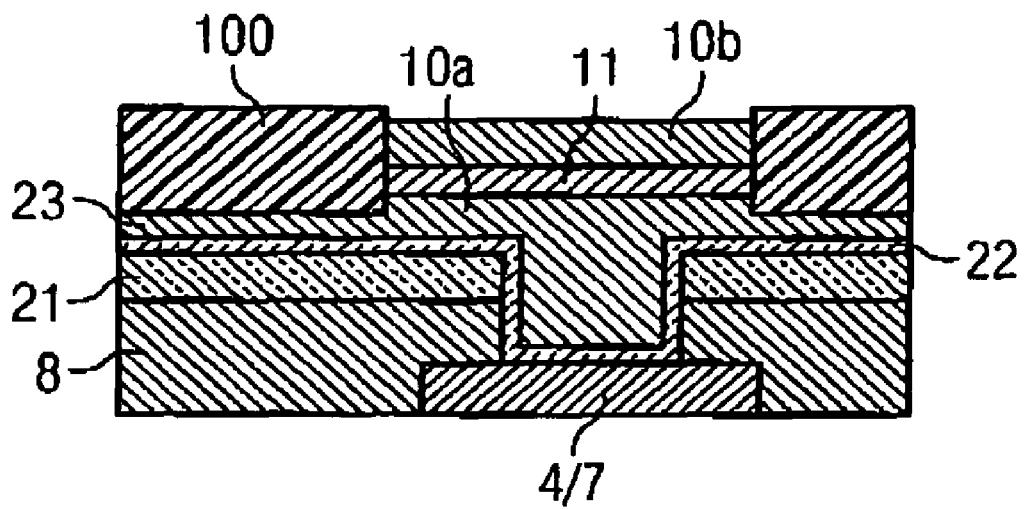
Figure 1G:
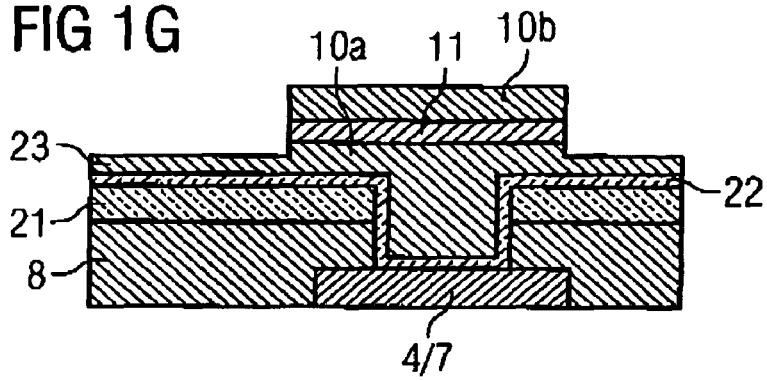

Thereafter, as illustrated in FIG. 1e), a stabilization layer 11, e.g. of NiP, is deposited/grown on the first copper layer 10a, using the photoresist pattern 100, preferably by electrochemical plating. Thereafter, a second copper layer 10b is deposited/grown on the stabilization layer 11, again using the photoresist pattern 100, as shown in FIG. 1f), preferably by electrogalvanic plating. Thereafter, the photoresist pattern 100 is removed, as shown in FIG. 1g). Subsequently, the 300 nm Cu seed layer is removed by wet etching, and then the WTi layer 22 is removed.

Figure 1H:
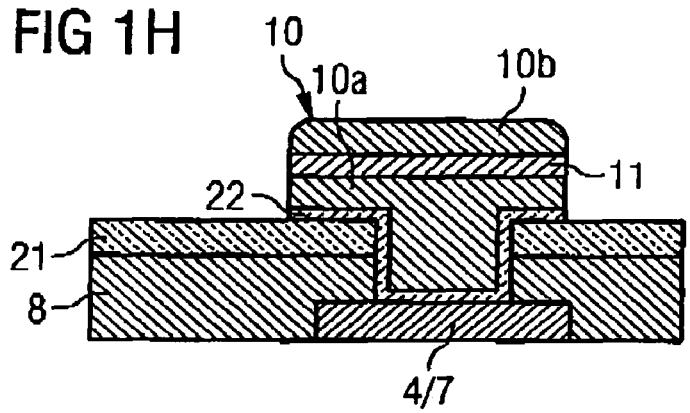
Figure 3:
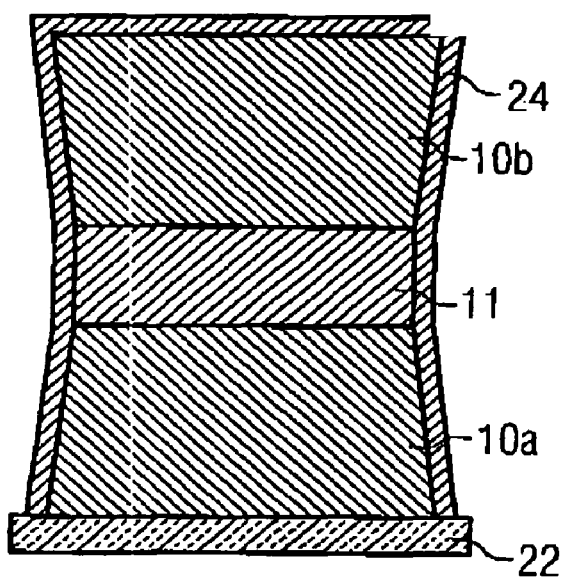
FIG. 3 illustrates a metallization layer for a power semiconductor device in a cross-sectional view corresponding to FIG. 2b), with a passivation layer applied to the metallization layer according to another embodiment of the present teachings.

The thickness of the first and second Cu layers 10a, 10b is several microns (μm), such that the wet etching of the Cu seed layer 23 will not significantly change the thickness of the first and second copper layers 10a, 10b. The resulting structure of a power current conducting metallization 10 is shown in FIG. 1h). In FIG. 1h), the power metallization 10 is shown contacting a wiring structure 4/7 in the blind hole. As can be seen in FIGS. 2, 3, the same manufacturing process is applicable at those positions of the power semiconductor IC device, where the power metallization 10 is deposited on those parts of the structure where a blind hole, via or trench is not present.

Figure 1I:
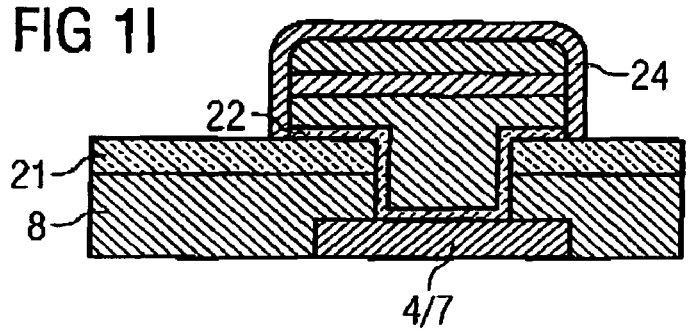

Optionally, as illustrated in FIG. 1i), a passivation layer 24 may be formed on the power metallization 10, e.g. a NiMoP/Pd/Au layer structure deposited by electrochemical plating.

Figure 1J:
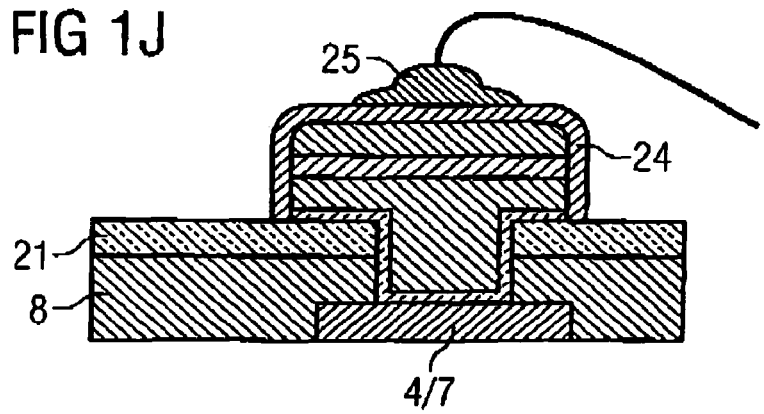

Thereafter, as schematically illustrated in FIG. 1j), a bonding process, e.g., a gold nail head or Al wedge bonding process, may be performed, thereby resulting in a bond 25.

If NiMoP is used as a material for the passivation layer 24, the Mo content is preferably higher than 5%, more preferably in the range of 8 to 20%, and more preferably about 11%. The reason is that a higher Mo content makes the layer softer and prevents the generation of cracks.

If NiMoP is used in the stabilization layer 11, the Mo content is preferably 5% or less, more preferably in the range of 3 to 5%, which makes the layer harder.

It is explicitly stated that all features disclosed in the description and/or the claims are intended to be disclosed separately and independently from each other for the purpose of original disclosure as well as for the purpose of restricting the claimed invention independent of the composition of the features in the embodiments and/or the claims. It is explicitly stated that all value ranges or indications of groups of entities disclose every possible intermediate value or intermediate entity for the purpose of original disclosure as well as for the purpose of restricting the claimed invention, in particular as limits of value ranges.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A power semiconductor device, comprising:
a substrate; and
a layer structure formed on the substrate, the layer structure comprising a bonding pad and a single metallization layer comprising copper disposed on the bonding pad, wherein the single metallization layer is formed as a stack structure including at least two copper layers and a stabilization layer sandwiched between the two copper layers, wherein the stabilization layer is in direct contact with each of the two copper layers and comprises a multi-layer of Ni/NiP/Ni, Ni/NiMoP/Ni, Ni/NiPd/Ni, or Ni/NiB/Ni, and wherein the at least two copper layers and the stabilization layer each have a same width throughout a thickness of the stack structure, and wherein the thickness of the stack structure enables the single metallization layer to conduct power currents.

2. The power semiconductor device according to claim 1, wherein the copper layers have a thickness in the range of 1 to 10 μm.

3. The power semiconductor device according to claim 2, wherein the stabilization layer has a thickness in the range of 1 to 5 μm.

4. The power semiconductor device according to claim 3, further comprising a passivation layer on the metallization layer.

5. The power semiconductor device according to claim 4, wherein the passivation layer has a NiMoP/Pd/Au layer structure.

6. A metallization layer for a power semiconductor device, comprising:
at least two power current conducting layers disposed on a bonding pad of the power semiconductor device, each power current conducting layer substantially comprising a copper material; and
a stabilization layer sandwiched between and in direct contact with the two power current conducting layers, the stabilization layer having a hardness that is at least twice the hardness of copper, wherein the at least two power current conducting layers and the stabilization layer each have a same width throughout and together provide a thickness which enables the metallization layer to conduct power currents, and wherein the stabilization layer comprises a multi-layer of Ni/NiP/Ni, Ni/NiMoP/Ni, Ni/NiPd/Ni, or Ni/NiB/Ni.

7. The metallization layer according to claim 6, wherein the power current conducting layers are made of copper.

* * * * *